(12) United States Patent
Koh et al.

(10) Patent No.: US 6,833,326 B2
(45) Date of Patent: Dec. 21, 2004

(54) METHOD FOR FORMING FINE PATTERNS IN SEMICONDUCTOR DEVICE

(75) Inventors: Cha Won Koh, Seoul (KR); Yoon Suk Hyun, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 175 days.

(21) Appl. No.: 10/338,516

(22) Filed: Jan. 8, 2003

(65) Prior Publication Data

US 2003/0186547 A1 Oct. 2, 2003

(30) Foreign Application Priority Data

Mar. 26, 2002 (KR) .............................. 10-2002-0016350

(51) Int. Cl.[7] .............................................. H01L 21/44
(52) U.S. Cl. ....................................... 438/725; 430/314
(58) Field of Search ................................ 438/725, 681, 438/689, 700; 430/314

(56) References Cited

U.S. PATENT DOCUMENTS

| | | | |
|---|---|---|---|
| 5,350,485 A | * 9/1994 | Shiraishi et al. | 216/13 |
| 6,074,804 A | 6/2000 | Endo et al. | |
| 6,132,936 A | 10/2000 | Jung | |
| 6,146,806 A | 11/2000 | Maeda et al. | |
| 6,150,069 A | 11/2000 | Jung et al. | |
| 6,225,020 B1 | 5/2001 | Jung et al. | |
| 6,309,796 B1 | 10/2001 | Nakashima et al. | |
| 6,312,868 B1 | 11/2001 | Kong et al. | |
| 6,368,773 B1 | 4/2002 | Jung et al. | |
| 6,599,844 B2 | * 7/2003 | Koh et al. | 438/725 |
| 6,696,363 B2 | * 2/2004 | Lee et al. | 438/681 |

FOREIGN PATENT DOCUMENTS

| | | |
|---|---|---|
| JP | 11279227 | 10/1999 |
| JP | 11349637 | 12/1999 |
| JP | 239436 | 9/2000 |
| JP | 0038391 | 11/2000 |
| JP | 353937 | 12/2001 |

* cited by examiner

*Primary Examiner*—Long Pham
*Assistant Examiner*—(Vikki) Hoa B. Trinh
(74) *Attorney, Agent, or Firm*—Ladas & Parry LLP

(57) ABSTRACT

Disclosed is a method of forming a fine pattern in a semiconductor device using a photolithography process, which comprises: coating a photoresist layer for an I-line and a positive type ArF photoresist layer on a semiconductor substrate that includes a conductive layer; performing exposure and a first baking process on the resultant substrate by using an etch-mask of a desired pattern to produce alcohol radicals (OH$^-$) or carboxyl acid (COOH) in the positive type ArF photoresist layer, in which a silylation reaction can be produced; removing the etch-mask; performing a development process to the resultant structure to form a first photoresist pattern; performing exposure and a second baking process on the substrate that includes the first photoresist pattern; performing a silylation process to the substrate to which the second baking process has been performed, by using an HMDS to form a silicon oxide layer on the surface of the first photoresist pattern through reaction between the alcohol radicals (OH$^-$) or the carboxyl acid (COOH) and the HMDS; performing a dry development process to the photoresist layer for the I-line by using the first photoresist pattern along with the silicon oxide layer as an etch-mask in order to form a second photoresist pattern; and etching the conductive layer by using the first and second photoresist patterns together with the silicon oxide layer as an etch-mask in order to form bit-lines.

13 Claims, 5 Drawing Sheets

METHOD FOR FORMING FINE PATTERNS IN SEMICONDUCTOR DEVICE

BACKGROUND OF THE INVENTION

1. Field of the Invention

The present invention relates to a method for fabricating a semiconductor device, and more particularly to a method for forming fine patterns in a semiconductor device using a photolithography process.

2. Description of the Prior Art

As generally known in the art, in the case of a conventional photolithography process in the fabrication of semiconductor devices, a 0.25 μm design rule has been applied and a KrF light source has been employed. However, the KrF light source has been confronted with limitations in photoresist patterning, and so an ArF light source with 193 nm wavelength substituting for the KrF light source has been tested as to whether it is applicable to the fabrication of semiconductor devices or not.

However, when the ArF light source has been tested in the photolithography process of the fabrication process of semiconductor devices, many problems have occurred, one of which is that the photoresist barrier for the ArF light source must have a high absorption ratio against the 193 nm wavelength in order to improve the etching resistance and thereby reduce the coating thickness of the photoresist.

The ratio of a horizontal thickness of the photoresist against a vertical thickness of the photoresist should be 3:1 in general in order to prevent breakage of the pattern, and the photoresist for the ArF light source has a weak etching resistance half times of an I-line photoresist, so the thinness of the photoresist for the ArF light source becomes a burden on an etching process.

FIGS. 1 and 2 are photographs showing problems produced in the formation of fine patterns in a semiconductor device by using a photoresist for an ArF light source in accordance with the conventional art.

Specifically, FIG. 1 is a photograph showing results of etching a contact for the formation of a landing plug by using a photoresist for an ArF light source in accordance with the conventional art, and FIG. 2 is a photograph showing results of etching a gate by using a photoresist for the ArF light source in accordance with the conventional art.

As shown in FIGS. 1 and 2, in the case of formation of the contact for forming the landing plug by using the photoresist for the ArF light source having a weak etching resistance, there has occurred a problem in that transformation of the pattern is produced.

SUMMARY OF THE INVENTION

Accordingly, the present invention has been made to solve the above-mentioned problems occurring in the prior art, and an object of the present invention is to provide a method for forming fine patterns in a semiconductor device, capable of forming fine patterns by using a photoresist having a good etching resistance.

In order to accomplish this object, there is provided a method for forming a fine pattern in a semiconductor device, comprising the steps of: coating a photoresist layer for an I-line and a positive type ArF photoresist layer on a semiconductor substrate that includes a conductive layer; performing exposure and a first baking process on the resultant substrate by using an etch-mask of a desired pattern to produce alcohol radicals ($OH^-$) or carboxyl acid (COOH) in the positive type ArF photoresist layer, in which a silylation reaction can occur; removing the etch-mask; performing a development process to the resultant structure to form a first photoresist pattern; performing exposure and a second baking process on the substrate including the first photoresist pattern; performing a silylation process to the substrate to which the second baking process has been performed, by using a HMDS to form a silicon oxide layer on the surface of the first photoresist pattern through reaction between the alcohol radicals ($OH^-$) or the carboxyl acid (COOH) and the HMDS; performing a dry development process to the photoresist layer for the I-line by using the first photoresist pattern together with the silicon oxide layer as an etch-mask in order to form a second photoresist pattern; and etching the conductive layer by using the first and second photoresist patterns along with the silicon oxide layer as an etch-mask in order to form bit-lines.

In the embodiment of the present invention, the substrate is vapor treated, prior to the coating of the photoresist layer for the I-line.

Also, photoresist layer for the I-line is coated to the thickness of 0.2 to 1.5 μm, and the positive type ArF photoresist layer is coated to the thickness of 0.05 to 0.2 μm.

Further, a step of performing a hard baking process to the photoresist layer for the I-line for 90 seconds at the temperature of 200° C. is added, prior to the coating of the positive type ArF photoresist layer, and a step of performing a soft baking for 90 seconds at the temperature of 110° C. can be added after the coating of the positive type ArF photoresist layer.

In the present invention, the development process is performed for 60 seconds by using a TMAH solution, and the concentration of the TMAH solution is 0.1 to 10%.

Also, the ArF exposure process is performed with supplying energy of 5 to 50 $mJ/cm^2$ in the step of performing exposure and second baking process to the substrate including the first photoresist pattern.

In the present invention, the first and second baking processes are performed for 90 seconds at the temperature of 110° C., and the silylation process is performed for 90 seconds at the temperature of 120° C.

Further, the silyalating agent used in the silylation process is any one compound selected from the group composed of hexamethyl disilazane, tetramethyl disilazane, bisdimethylamino dimethylsilane, bisdimethylamino methylsilane, dimethylsilyl dimethylamine, dimethylsilyl diethylamine, trimethylsilyl dimethylamine, trimethylsilyl diethylamine, and dimethylamino pentamethyldisilane.

In the present invention, the dry development process is performed using an oxygen plasma, and is performed with maintaining an upper electrode at 500 watts (W) and a lower electrode at 100 watts (W), and applying a bias power of 75 watts (W) and supplying oxygen gas of 35 sccm at the temperature of 30° C. and the pressure of 5 mTorr.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

FIGS. 3a to 3f are cross-sectional views for illustrating a method for forming fine patterns in a semiconductor device in accordance with the present invention.

Figure 1:
FIG. 1 is a photograph showing results of etching a contact for the formation of a landing plug using a photoresist for an ArF light source in accordance with the conventional art.
Figure 2:
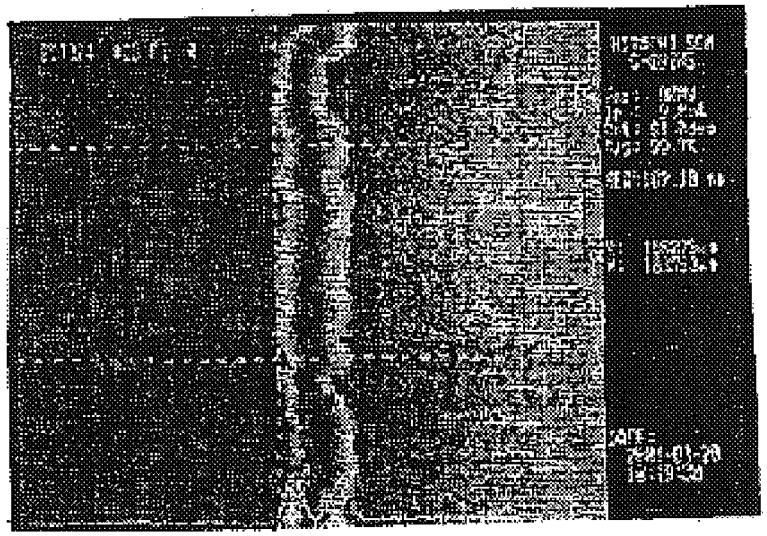
FIG. 2 is a photograph showing results of etching a gate using a photoresist for the ArF light source in accordance with the conventional art.
Figure 3A:
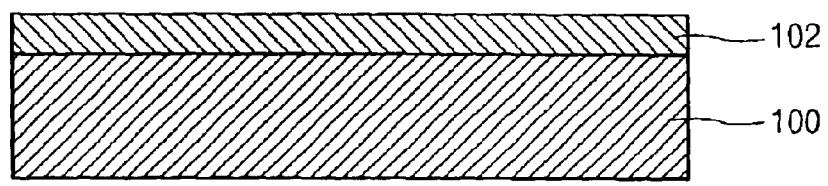
FIGS. 3a to 3f are cross-sectional views for illustrating a method for forming fine patterns in a semiconductor device in accordance with the present invention.

According to a method for forming fine patterns in a semiconductor device in accordance with the present invention, as shown in FIG. 3a, a photoresist layer 102 for an I-line is formed on a semiconductor substrate 100 that includes a conductive layer (not shown). At this time, the substrate 100 is vapor treated using a hexamethyl disilazane (HMDS) to increase an adhesive force between the photoresist layer and the substrate 100. Also, the photoresist layer 102 for the I-line is sprayed to a thickness of 0.2 to 1.5 μm, preferably to a thickness of 1.0 μm. Alternatively, a reflection-protective layer made of organic materials may be coated to a thickness of 0.5 to 3.0 μm instead of the photoresist layer for the I-line.

Figure 3B:
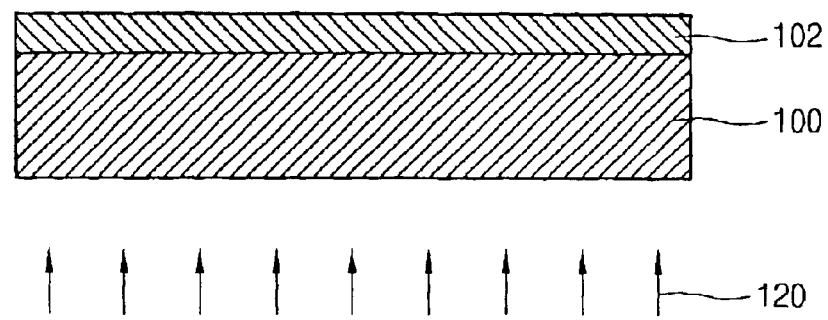

Then, as shown in FIG. 3b, a hard baking process 120 is performed on the photoresist layer for the I-line for 90 seconds at the temperature of 200° C.

Figure 3C:
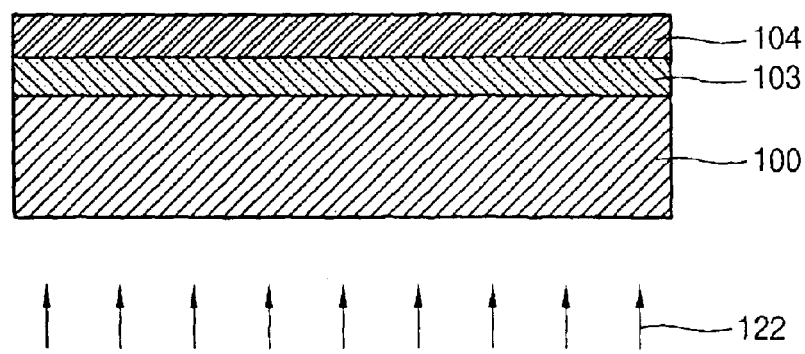

Next, as shown in FIG. 3c, a positive type ArF photoresist layer 104 is coated on the photoresist layer 103 for the I-line, to which the hard baking process has been performed, and a soft baking process 122 is performed on the positive type ArF photoresist layer 104 for 90 seconds at the temperature of 110° C. At this time, the positive type ArF photoresist layer 104 is coated thinly, to a thickness of 0.05 to 0.2 μm, so as not to break the photoresist pattern. In this embodiment, any one selected from a group composed of an EUV, an E-beam, an ion-beam and an x-ray can be used instead of the positive type ArF light source.

Figure 3D:
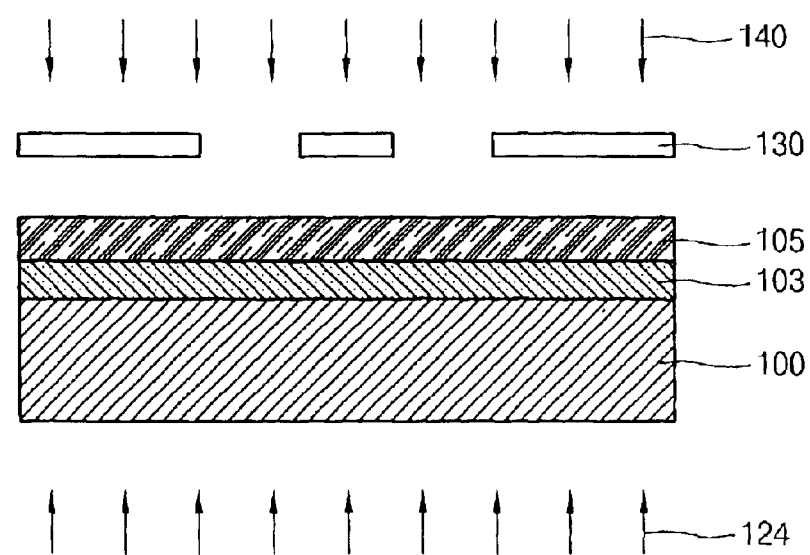

Subsequently, as shown in FIG. 3d, an etch-mask 130 of a desired pattern is covered on the positive type ArF photoresist layer 105, to which the soft baking has been performed, and an exposure process is performed by radiating an ArF light source 140, and then a post exposure (PE) baking process 124 is performed for 90 seconds at the temperature of 110° C. In this embodiment, any one selected from the group composed of an ArF, an EUV, an E-beam, an ion-beam and an x-ray can be used instead of the ArF light source 140.

Figure 4:
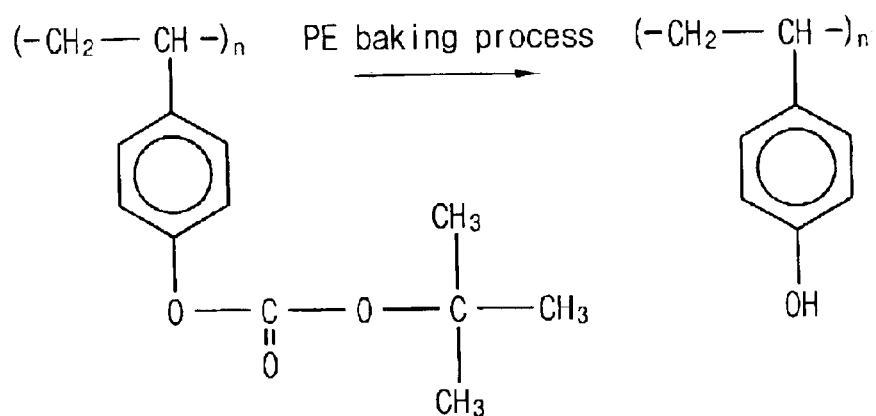
FIGS. 4 and 5 are views showing mechanisms for producing alcohol radicals and carboxyl acid, in which a silylation reaction can be produced, in the case of performing exposure and baking of a positive type photoresist for an ArF light source in accordance with the present invention.
Figure 5:
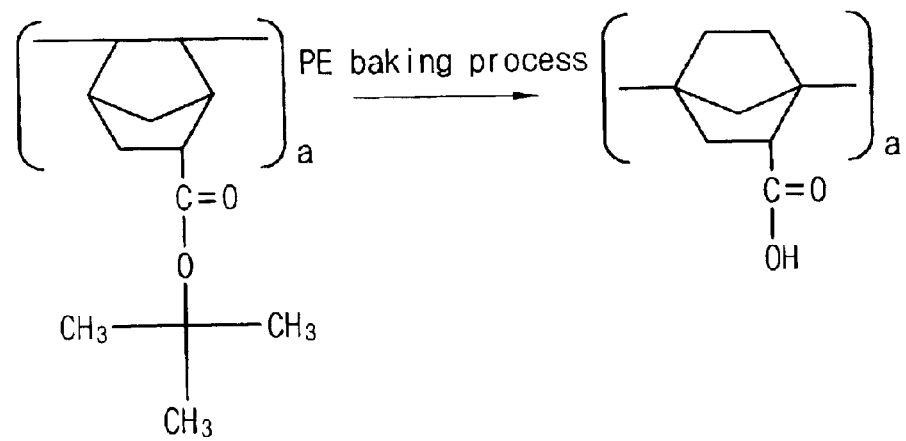

FIGS. 4 and 5 are views showing mechanisms for producing alcohol radicals and carboxyl acid, in which a silylation reaction can be produced, in the case of performing exposure and baking of the positive type photoresist for the ArF light source in accordance with the present invention.

When the light-source has been radiated to the positive type ArF photoresist layer 105 and the PE baking process 124 has been performed, as shown in FIGS. 4 and 5, alcohol radicals (OH$^-$) or carboxyl acid (COOH) that can bring about a silylation reaction is produced.

Figure 3E:
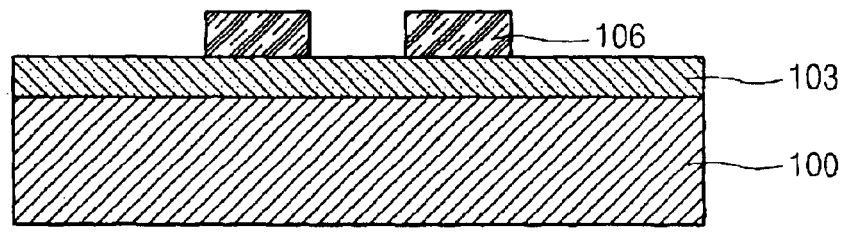

Then, after removing the etch-mask, as shown in FIG. 3e, a first photoresist pattern 106 is formed by developing the positive type ArF photoresist layer, to which the PE baking process has been performed, by using a TMAH solution for 60 seconds. At this time, the concentration of the TMAH solution used is 0.1 to 10%, preferably 2.38%.

Next, an exposure process is performed to the substrate that includes the first photoresist pattern 106 by using the ArF light source, and then a baking process is performed for 90 seconds at the temperature of 110° C. At this time, the ArF light source has energy of 5 to 50 mJ/cm$^2$, preferably of 30 mJ/cm$^2$.

Figure 3F:
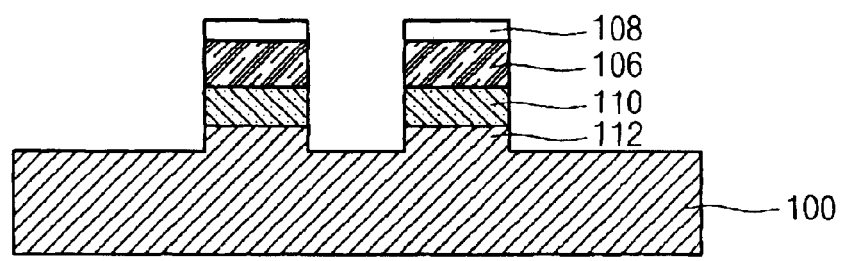

Subsequently, as shown in FIG. 3f, a silylation process is performed on the resultant structure for 90 seconds at the temperature of 120° C. using the HMDS to form a silicon oxide layer (SiO$_x$) 108 on the first photoresist pattern 106. At this time, the silicon oxide layer 108 is formed through the bonding of the alcohol radicals (OH$^-$) or the carboxyl acid (COOH) produced in the PE baking process with the silicon of the HMDS. Further, the silyalating agent used in the silylation process can be any one compound selected from a group composed of hexamethyl disilazane, tetramethyl disilazane, bisdimethylamino dimethylsilane, bisdimethylamino methylsilane, dimethylsilyl dimethylamine, dimethylsilyl diethylamine, trimethylsilyl dimethylamine, trimethylsilyl diethylamine, and dimethylamino pentamethylsilane.

Then, a second photoresist pattern 110 is formed on the resultant structure through performing a dry development process while using oxygen plasma and using the first photoresist pattern 106 together with the silicon oxide layer (SiO$_x$) 108 as an etch-mask. At this time, the dry development is performed while maintaining the wattage of an upper electrode at 500 watts (W) and the wattage of a lower electrode at 100 watts (W) and while applying a power bias of 75 watts (W) and supplying oxygen gas of 35 sccm at a temperature of 30° C. and a pressure of 5 mTorr.

Next, bit-lines 112 are formed through the etching of the conductive layer (not shown) while using the first and second photoresist patterns 106 and 110 along with the silicon oxide layer 108 as an etch-mask.

As described above, according to the present invention, pattern images are formed on the positive type ArF photoresist, and the images formed on the positive type ArF photoresist are transferred to the photoresist for the I-line, which has a good etching resistance thereby preventing the transformation of the pattern occurring from a lack of etching resistance and preventing a decrease of the production yield originating from the transformation of the pattern, thus resulting in the reduction of the production costs of the semiconductor device.

Also, according to the present invention, a semiconductor device to which a design rule of under 100 nm is applied can be fabricated through use of the positive type ArF photoresist.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming fine patterns in a semiconductor device, comprising the steps of:

coating a photoresist layer for an I-line and a positive type ArF photoresist layer on a semiconductor substrate that includes a conductive layer;

performing exposure and a first baking process on the resultant substrate by using an etch-mask of a desired pattern to produce alcohol radicala (OH⁻) or carboxyl acid (COOH) in the positive type ArF photoresist layer, in which a silylation reaction can be produced;

removing the etch-mask;

performing a development process to the resultant structure to form a first photoresist pattern;

performing exposure and a second baking process on the substrate that includes the first photoresist pattern;

performing a silylation process to the substrate, to which the second baking process has been performed, by using an HMDS to form a silicon oxide layer on the surface of the first photoresist pattern through reaction between the alcohol radicals (OH⁻) or the carboxyl acid (COOH) and the HMDS;

performing a dry development process to the photoresist layer for the I-line by using the first photoresist pattern together with the silicon oxide layer as an etch-mask in order to form a second photoresist pattern; and etching the conductive layer by using the first and second photoresist patterns along with the silicon oxide layer as an etch-mask in order to form bit-lines.

2. The method for forming fine patterns according to claim 1, wherein the substrate is vapor treated, prior to the coating of the photoresist layer for the I-line.

3. The method for forming fine patterns according to claim 1, wherein the photoresist layer for the I-line is coated to a thickness of 0.2 to 1.5 µm, and the positive type ArF photoresist layer is coated to a thickness of 0.05 to 0.2 µm.

4. The method for forming fine patterns according to claim 1, further comprising a step of performing a hard baking process on the photoresist layer for the I-line for 90 seconds at a temperature of 200° C., prior to the coating of the positive type ArF photoresist layer.

5. The method for forming fine patterns according to claim 1, further comprising a step of performing a soft baking for 90 seconds at a temperature of 110° C., after the coating of the positive type ArF photoresist layer.

6. The method for forming fine patterns according to claim 1, wherein the development process is performed for 60 seconds using a TMAH solution.

7. The method for forming fine patterns according to claim 6, wherein the concentration of the TMAH solution is 0.1 to 10%.

8. The method for forming fine patterns according to claim 1, wherein the ArF exposure process is performed while supplying energy of 5 to 50 mJ/cm² during the step of performing the exposure and the second baking process to the substrate that includes the first photoresist pattern.

9. The method for forming fine patterns according to claim 1, wherein the first and second baking processes are performed for 90 seconds at a temperature of 110° C.

10. The method for forming fine patterns according to claim 1, wherein the silylation process is performed for 90 seconds at a temperature of 120° C.

11. The method for forming fine patterns according to claim 1 or claim 10, wherein the silyalating agent used in the silylation process is any one compound selected from a group composed of hexamethyl disilazane, tetramethyl disilazane, bisdimethylamino dimethylsilane, bisdimethylamino methylsilane, dimethylsilyl dimethylamine, dimethylsilyl diethylamine, trimethylsilyl dimethylamine, trimethylsilyl diethylamine, and dimethylamino pentamethyldisilane.

12. The method for forming fine patterns according to claim 1, wherein the dry development process is performed using an oxygen plasma.

13. The method for forming fine patterns according to claim 1 or claim 12, the dry development process is performed while maintaining an upper electrode at 500 watts (W) and a lower electrode at 100 watts (W), and applying a power bias of 75 watts (W) and supplying oxygen gas of 35 sccm at a temperature of 30° C. and a pressure of 5 mTorr.

* * * * *